(12) United States Patent
Coquerel et al.

(10) Patent No.: US 10,936,404 B2
(45) Date of Patent: Mar. 2, 2021

(54) TECHNOLOGIES FOR ERROR DETECTION IN COMPRESSED DATA STREAMS

(71) Applicant: Intel Corporation, Santa Clara, CA (US)

(72) Inventors: Laurent Coquerel, Limerick (IE); Paul Hough, Shannon (IE)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 16/024,771

(22) Filed: Jun. 30, 2018

(65) Prior Publication Data

US 2019/0042354 A1 Feb. 7, 2019

(51) Int. Cl.
| | | |
|---|---|---|
| G06F 11/10 | (2006.01) | |
| H03M 13/00 | (2006.01) | |
| H03M 13/09 | (2006.01) | |
| G06F 3/06 | (2006.01) | |
| H03M 7/30 | (2006.01) | |
| H03M 7/40 | (2006.01) | |

(52) U.S. Cl.
CPC ........ *G06F 11/1004* (2013.01); *G06F 3/0619* (2013.01); *G06F 3/0647* (2013.01); *G06F 3/0656* (2013.01); *G06F 3/0673* (2013.01); *H03M 7/30* (2013.01); *H03M 13/09* (2013.01); *H03M 13/6312* (2013.01); *H03M 7/3086* (2013.01); *H03M 7/40* (2013.01); *H03M 7/6041* (2013.01)

(58) Field of Classification Search
CPC .. G06F 11/1004; G06F 3/0647; G06F 3/0673; G06F 3/0656; G06F 3/0619; G06F 13/09; G06F 13/6312; H03M 7/30; H03M 13/09; H03M 13/6312; H03M 7/3086; H03M 7/6041; H03M 7/40; H03M 7/00; H03M 7/26; G11C 2207/102
USPC ........................................................ 714/807
See application file for complete search history.

(56) References Cited

U.S. PATENT DOCUMENTS

| | | | | | |
|---|---|---|---|---|---|
| 5,465,338 | A | * | 11/1995 | Clay | ...................... G06F 3/0601 710/316 |
| 6,625,671 | B1 | * | 9/2003 | Collette | .............. G06F 13/4059 710/20 |

(Continued)

FOREIGN PATENT DOCUMENTS

WO WO-2016151831 A1 * 9/2016 ............... G06F 3/06

*Primary Examiner* — Albert Decady
*Assistant Examiner* — Enamul M Kabir
(74) *Attorney, Agent, or Firm* — Compass IP Law PC (57) ABSTRACT

Technologies for error recovery in compressed data streams include a compute device configured to compress uncompressed data of an input stream to generate compressed data, perform a compression error check on the compressed data to verify integrity of the compressed data, and determine, as a result of the performed compression error check, whether the compressed data included a compression error. The compute device is further configured to transfer, in response to a determination that the performed compression error check indicated that the compressed data included the compression error, the uncompressed data into a destination buffer, and store an indication with the uncompressed data into the destination buffer, wherein the indication is usable to identify that the uncompressed data has been transferred into the destination buffer. Other embodiments are described herein.

21 Claims, 3 Drawing Sheets

(56) References Cited

U.S. PATENT DOCUMENTS

| | | | | |
|---|---|---|---|---|
| 2001/0038642 | A1* | 11/2001 | Alvarez, II | H03M 7/40 370/477 |
| 2008/0172594 | A1* | 7/2008 | Unruh | G06F 11/1008 714/799 |
| 2011/0252183 | A1* | 10/2011 | Cho | H03M 7/30 711/102 |
| 2012/0072641 | A1* | 3/2012 | Suzuki | G06F 12/0246 711/103 |
| 2014/0074805 | A1* | 3/2014 | Kapoor | G06F 16/902 707/693 |
| 2016/0004642 | A1* | 1/2016 | Sugimoto | G06F 12/0871 711/128 |
| 2018/0167481 | A1* | 6/2018 | Bhaskar | H03M 7/00 |

* cited by examiner

TECHNOLOGIES FOR ERROR DETECTION IN COMPRESSED DATA STREAMS

BACKGROUND

Modern computing devices have become ubiquitous tools for personal, business, and social uses. As such, many modern computing devices are capable of connecting to various data networks, including the Internet, to transmit and receive data communications over the various data networks at varying rates of speed. To facilitate communications between computing devices, the data networks typically include one or more network computing devices (e.g., compute servers, storage servers, etc.) to route communications (e.g., via switches, routers, etc.) that enter/exit a network (e.g., north-south network traffic) and between network computing devices in the network (e.g., east-west network traffic). In present packet-switched network architectures, data is transmitted in the form of network packets between networked computing devices. At a high level, data is packetized into a network packet at one computing device and the resulting packet transmitted, via a transmission device (e.g., a network interface controller (NIC) of the computing device), to another computing device over a network.

Due to bandwidth constraints and latency associated with moving large amounts of data across a network, as well as storage considerations, data compression has become an integral computer operation used in many computing applications, including both server and client applications. For example, data compression may be used to reduce network bandwidth requirements and/or storage requirements for cloud computing applications. Such applications in networked computing devices often require lossless compression algorithms to perform the compression and decompression of data stream in-flight. However, if even a single bit of data is corrupted in the resulting compressed data of a stream of data, the entire stream of data can be prevented from being decompressed.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one of A, B, and C" can mean (A); (B); (C): (A and B); (A and C); (B and C); or (A, B, and C). Similarly, items listed in the form of "at least one of A, B, or C" can mean (A); (B); (C): (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 1:
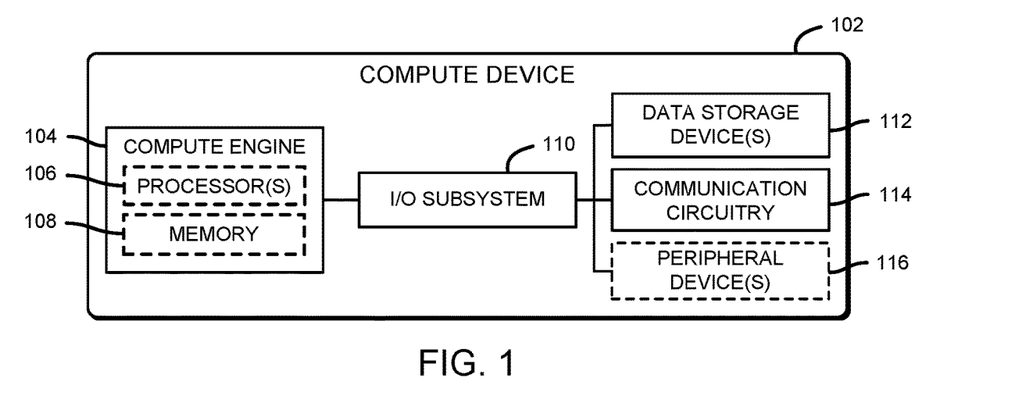
FIG. 1 is a simplified block diagram of at least one embodiment of a compute device for error recovery in compressed data streams.

Referring now to FIG. 1, in an illustrative embodiment, a compute device 102 for error recovery in compressed data streams is shown. In use, as described in further detail below, the compute device 102 performs a compression operation on data (e.g., of an input stream of data). It should be appreciated that a single bit corrupted in compressed data can prevent an entire stream of data from being decompressed. To verify the compression operation was performed without error, the compute device 102 is further to perform a compression validation operation on the compressed data. To do so, the compute device 102 is configured to decompress the compressed data, resulting in decompressed data, and compare the decompressed data with the data on which the compression was initially performed upon. Accordingly, the compute device 102 can determine whether the compression was performed successfully (i.e., without error) as a result of the comparison.

Additionally, the compute device 102 is configured to store either the compressed data or the uncompressed data, based on the result of the comparison. In other words, instead of offloading the error recovery to the application similar to present technologies, the compute device 102 is configured to offer a second data path. The compute device 102 is further configured to provide an indication of whether the compressed data or the uncompressed data has been stored. To do so, the compute device 102 may be configured to prepend a header to the compressed data or the uncompressed data, whichever was stored, that includes an indication of whether the data stored is compressed or not. Accordingly, unlike present technologies, the throughput performance can be improved, as a processor (e.g., one of the processor(s) 106) is no longer required to handle unsuccessfully compressed data. Furthermore, the software stack no longer needs to be notified that an invalid compressed output has been produced; thereby, the software stack does not need to be notified that a data recovery occurred.

The compute device 102 may be embodied as any type of computation or computer device capable of performing the functions described herein, including, without limitation, a computer, a server (e.g., stand-alone, rack-mounted, blade, etc.), a sled (e.g., a compute sled, an accelerator sled, a storage sled, a memory sled, etc.), an enhanced or smart NIC (e.g., a host fabric interface (HFI)), a network appliance (e.g., physical or virtual), a web appliance, a distributed computing system, a processor-based system, and/or a multiprocessor system. It should be appreciated that the functions described herein may be performed on any bump-in-the-wire applications with one-to-one ingress/egress ports (e.g., a gateway, an Internet Protocol Security (IPSec) appliance, etc.), but not all packet processing workloads (e.g., routers or switches that distribute traffic to multiple ports).

The illustrative compute device 102 includes a compute engine 104, an I/O subsystem 110, one or more data storage devices 112, communication circuitry 114, and, in some embodiments, one or more peripheral devices 116. It should be appreciated that the compute device 102 may include other or additional components, such as those commonly found in a typical computing device (e.g., various power and cooling devices, graphics processing unit(s), and/or other components), in other embodiments, which are not shown here to preserve clarity of the description. Additionally, in some embodiments, one or more of the illustrative components may be incorporated in, or otherwise form a portion of, another component.

The compute engine 104 may be embodied as any type of device or collection of devices capable of performing the various compute functions as described herein. In some embodiments, the compute engine 104 may be embodied as a single device such as an integrated circuit, an embedded system, a field-programmable-array (FPGA), a system-on-a-chip (SoC), an application specific integrated circuit (ASIC), reconfigurable hardware or hardware circuitry, or other specialized hardware to facilitate performance of the functions described herein. Additionally, in some embodiments, the compute engine 104 may include, or may be embodied as, one or more processors 106 (i.e., one or more central processing units (CPUs), each having one or more processing cores) and memory 108.

The processor(s) 106 may be embodied as any type of processor(s) capable of performing the functions described herein. For example, the processor(s) 106 may be embodied as one or more single-core processors, multi-core processors, digital signal processors (DSPs), microcontrollers, or other processor(s) or processing/controlling circuit(s). In some embodiments, the processor(s) 106 may be embodied as, include, or otherwise be coupled to an FPGA, an ASIC, reconfigurable hardware or hardware circuitry, or other specialized hardware to facilitate performance of the functions described herein.

The memory 108 may be embodied as any type of volatile or non-volatile memory or data storage capable of performing the functions described herein. It should be appreciated that the memory 108 may include main memory (i.e., a primary memory) and/or cache memory (i.e., memory that can be accessed more quickly than the main memory). Volatile memory may be a storage medium that requires power to maintain the state of data stored by the medium. Non-limiting examples of volatile memory may include various types of random access memory (RAM), such as dynamic random access memory (DRAM) or static random access memory (SRAM).

The compute engine 104 is communicatively coupled to other components of the compute device 102 via the I/O subsystem 110, which may be embodied as circuitry and/or components to facilitate input/output operations with the processor 106, the memory 108, and other components of the compute device 102. For example, the I/O subsystem 110 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 110 may form a portion of a SoC and be incorporated, along with one or more of the processor(s) 106, the memory 108, and other components of the compute device 102, on a single integrated circuit chip.

The one or more data storage devices 112 may be embodied as any type of storage device(s) configured for short-term or long-term storage of data, such as, for example, memory devices and circuits, memory cards, hard disk drives, solid-state drives, or other data storage devices. Each data storage device 112 may include a system partition that stores data and firmware code for the data storage device 112. Additionally or alternatively, each data storage device 112 may also include an operating system partition that stores data files and executables for an operating system.

The communication circuitry 114 may be embodied as any communication circuit, device, or collection thereof, capable of enabling communications between the compute device 102 and other computing devices, as well as any network communication enabling devices, such as an access point, network switch/router, etc., to allow communication over a communicatively coupled network. Accordingly, the communication circuitry 114 may be configured to use any one or more communication technologies (e.g., wireless or wired communication technologies) and associated protocols (e.g., Ethernet, Bluetooth®, WiFi®, WiMAX, LTE, 5G, etc.) to affect such communication.

It should be appreciated that, in some embodiments, the communication circuitry 114 may include specialized circuitry, hardware, or combination thereof to perform pipeline logic (e.g., hardware algorithms) for performing the functions described herein, including processing network packets (e.g., parse received network packets, determine destination computing devices for each received network packets, forward the network packets to a particular buffer queue of a respective host buffer of the compute device 102, etc.), performing computational functions, etc.

In some embodiments, performance of one or more of the functions of communication circuitry 114 as described herein may be performed by specialized circuitry, hardware, or combination thereof of the communication circuitry 114, which may be embodied as a SoC or otherwise form a portion of a SoC of the compute device 102 (e.g., incorporated on a single integrated circuit chip along with a processor 106, the memory 108, and/or other components of the compute device 102). Alternatively, in some embodiments, the specialized circuitry, hardware, or combination thereof may be embodied as one or more discrete processing units of the compute device 102, each of which may be capable of performing one or more of the functions described herein.

The one or more peripheral devices 116 may include any type of device that is usable to input information into the compute device 102 and/or receive information from the compute device 102. The peripheral devices 116 may be embodied as any auxiliary device usable to input information into the compute device 102, such as a keyboard, a mouse, a microphone, a barcode reader, an image scanner, etc., or output information from the compute device 102, such as a display, a speaker, graphics circuitry, a printer, a projector, etc. It should be appreciated that, in some embodiments, one or more of the peripheral devices 116 may function as both an input device and an output device (e.g., a touchscreen display, a digitizer on top of a display screen, etc.). It should be further appreciated that the types of peripheral devices 116 connected to the compute device 102 may depend on, for example, the type and/or intended use of the compute device 102. Additionally or alternatively, in some embodiments, the peripheral devices 116 may include one or more ports, such as a USB port, for example, for connecting external peripheral devices to the compute device 102.

Figure 2:
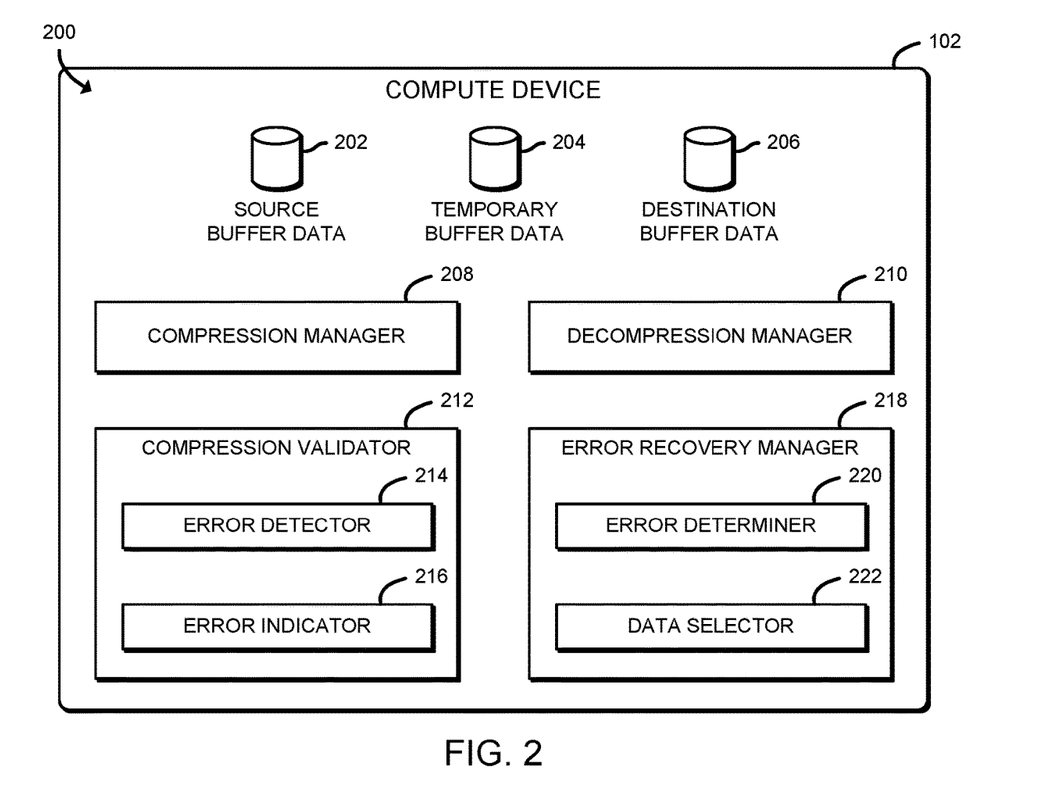
FIG. 2 is a simplified block diagram of at least one embodiment of an environment of the compute device of FIG. 1 for error recovery in compressed data streams.

Referring now to FIG. 2, in use, the compute device 102 establishes an environment 200 during operation. The illustrative environment 200 includes a compression manager 208, a decompression manager 210, a compression validator 212, and an error recovery manager 218. The various components of the environment 200 may be embodied as hardware, firmware, software, or a combination thereof. As such, in some embodiments, one or more of the components of the environment 200 may be embodied as circuitry or collection of electrical devices (e.g., compression management circuitry 208, decompression management circuitry 210, compression validation circuitry 212, error recovery management circuitry 218, etc.). It should be appreciated that, in such embodiments, one or more of the circuits (e.g., compression management circuitry 208, decompression management circuitry 210, compression validation circuitry 212, error recovery management circuitry 218, etc.) may form a portion of, or otherwise be established by, one or more of the compute engine 200 (i.e., the processor(s) 208 and/or the memory 204), the I/O subsystem 206, the network interface controller 212, the data storage device(s) 208, an application specific integrated circuit (ASIC), a programmable circuit such as a field-programmable gate array (FPGA), and/or other components of the compute device 102.

For example, any of the circuitry (e.g., the compression management circuitry 208, the decompression management circuitry 210, the compression validation circuitry 212, the error recovery management circuitry 218, etc.) may be embodied as at least a portion of the compute engine 200 and associated instructions stored in the memory 204 and/or the data storage device(s) 208, which may be executed by the processor(s) 202. Accordingly, it should be appreciated that, each of the functions described herein as being performed by the compression management circuitry 208, the decompression management circuitry 210, the compression validation circuitry 212, and/or the error recovery management circuitry 218 may be performed, at least in part, by one or more components of the compute device 102, such as the compute engine 104, the I/O subsystem 110, the communication circuitry 114, and/or other components of the compute device 102.

Additionally, in some embodiments, one or more of the illustrative components may form a portion of another component and/or one or more of the illustrative components may be independent of one another. Further, in some embodiments, one or more of the components of the environment 200 may be embodied as virtualized hardware components or emulated architecture, which may be established and maintained by the compute engine 104 or other software/hardware components of the compute device 102. It should be appreciated that some of the functionality of one or more of the components of the environment 300 as described herein may require a hardware implementation, in which case embodiments of components which implement such functionality will be embodied at least partially as hardware. It should be further appreciated that the compute device 102 may include other components, sub-components, modules, sub-modules, logic, sub-logic, and/or devices commonly found in a computing device (e.g., device drivers, interfaces, etc.), which are not illustrated in FIG. 2 for clarity of the description.

In the illustrative environment 200, the compute device 102 additionally includes source buffer data 202, temporary buffer data 204, and destination buffer data 206, each of which may be accessed by the various components and/or sub-components of the compute device 102. Further, each of the source buffer data 202, the temporary buffer data 204, and the destination buffer data 206 may be accessed by the various components of the compute device 102. Additionally, it should be appreciated that in some embodiments the data stored in, or otherwise represented by, each of the source buffer data 202, the temporary buffer data 204, and the destination buffer data 206 may not be mutually exclusive relative to each other. For example, in some implementations, data stored in the source buffer data 202 may also be stored as a portion of the temporary buffer data 204 and/or the destination buffer data 206, or in another alternative arrangement. As such, although the various data utilized by the compute device 102 is described herein as particular discrete data, such data may be combined, aggregated, and/or otherwise form portions of a single or multiple data sets, including duplicative copies, in other embodiments.

The compression manager 208, which may be embodied as hardware, firmware, software, virtualized hardware, emulated architecture, and/or a combination thereof as discussed above, is configured to perform a lossless compression (e.g., using a lossless compression algorithm, such as DEFLATE) on uncompressed input data to generate lossless compressed output data. For example, in some embodiments, the compression manager 208 may be embodied as a compression accelerator usable to offload the lossless compression of an input data stream. In some embodiments, the input data stream and/or data related thereto (e.g., length/size, address in memory, etc.) may be stored in the source buffer data 202. In an illustrative embodiment, the compression manager 208 may be configured to use a lossless compression format based on Lempel-Ziv based algorithms, such as the LZ77 compression algorithm. In such embodiments, data compressed using LZ77-based algorithms typically include a stream of symbols (or "tokens"). Each symbol may include literal data that is to be copied to the output or a reference to repeat data that has already been decompressed.

In furtherance of the illustrative embodiment, the compression manager 208 may be configured to execute an LZ77-based compression algorithm (e.g., DEFLATE) to match repeated strings of bytes in the data block. It should be appreciated that the DEFLATE algorithm uses LZ77 compression in combination with Huffman encoding to generate compressed output in the form of a stream of output symbols. The output symbols may include literal symbols, length symbols, or distance symbols, and each particular symbol may occur in the data block with a particular frequency. The symbol list thus may include a list of all symbols that occur with non-zero frequency in the data block, and the symbol list may include length/literal symbols or distance symbols. While illustratively described as using LZ77 compression in combination with Huffman encoding to generate compressed output, other compression algorithms may be used, such as may be dependent on the size of the history window associated with the compression algorithm. For example, the DEFLATE algorithm uses a 32-kilobyte history window when searching for matching data, while other, newer compression algorithms may use larger history windows, such as the Brotli and ZStandard compression algorithms that use history windows in the megabyte range.

The decompression manager 210, which may be embodied as hardware, firmware, software, virtualized hardware, emulated architecture, and/or a combination thereof as discussed above, is configured to decompress compressed input data to generate decompressed output data. For example, in some embodiments, the decompression manager 210 may be embodied as a decompression accelerator usable to offload the decompression of a compressed input data stream. It should be appreciated that the decompression manager 210 is configured to use a decompression algorithm corresponding to the lossless compress algorithm employed by the compression manager 208 to compress the data. In some embodiments, the compressed data stream and/or data related thereto (e.g., length/size, address in memory, etc.) may be stored in the temporary buffer data 204.

The compression validator 212, which may be embodied as hardware, firmware, software, virtualized hardware, emulated architecture, and/or a combination thereof as discussed above, is configured to validate whether the compression of the input data was successful (i.e., no bit errors were found in the compressed data resulting from the compression operation as performed by the compression manager 208). To do so, the illustrative compression validator includes an error detector 214 and an error indicator 216. The error detector 214 is configured to detect whether an error occurred during the compression of the input data by performing a compression error check on the compressed data. To do so, the error detector 214 is configured to retrieve the initial uncompressed data of the input stream that was compressed (e.g., via the compression manager 208), retrieve or otherwise receive the compressed data (e.g., from a storage buffer, from the compression manager 208, etc.), decompress the compressed data (e.g., via the decompression manager 210), and compare the decompressed data (e.g., from the temporary buffer data 204) to the initial uncompressed data of the input stream (e.g., from the source buffer data 202).

In some embodiments, the error detector 214 may be configured to compute a checksum (e.g., cyclic redundancy check (CRC)) of the respective data and then check to see that the checksums are the same. More particularly, the compression manager 208 may output a checksum of the clear text data in the input buffer as a result of a compression operation and the decompression manager 210 may output a checksum of the decompressed data in the output buffer as a result of the decompression operation. However, it should be appreciated that any comparator technique may be used to determine whether a compression error exists. For example, the error detector 214 may be configured to apply additional and/or alternative comparisons, such as a length/size of the decompressed data relative to a length/size of the uncompressed data, to detect a corrupted bit in the data stream. The error indicator 216 is configured to indicate whether an error was detected (e.g., updating a flag, generating a fault, generating an exception, etc.) to the error recovery manager 218 based on a result of the comparison performed by the error detector 214.

It should be appreciated that, in some embodiments, the compression validator 212 may form at least a portion of the compression manager 208. In other words, in such embodiments, the compression manager 208 may include the compression validator 212 to verify the compressed output data to confirm that the compression has been successful before releasing the compressed data and the corresponding compression error indicator to the error recovery manager 218. It should be further appreciated that, in some embodiments, the decompression manager 210 may additionally or alternatively form a portion of the compression manager 208. For example, in such embodiments, the compression manager 208 may form a heterogeneous design that includes interleaved hardware and software stages of compression and decompression.

The error recovery manager 218, which may be embodied as hardware, firmware, software, virtualized hardware, emulated architecture, and/or a combination thereof as discussed above, is configured to manage the error recovery in the event of a detected compression error. To do so, the illustrative error recovery manager 218 includes an error determiner 220 and a data selector 222. The error determiner 220 is configured to determine whether an error has been detected in the compressed data, such as may be provided by the compression validator 212, or more particularly by the error indicator 216 of the compression validator.

The data selector 222 is configured to select whether to transfer the compressed data (e.g., output from the compression manager 208) or the uncompressed data of the input stream. To do so, the data selector 222 is configured to interpret whether a compression error has been detected (e.g., by the error determiner 220) based on the associated indication of error (e.g., a "0" indicating an error-free/successful compression operation or a "1" indicating an error/unsuccessful compression operation). The data selector 222 is additionally configured to initiate the storage of either the compressed data or the uncompressed data based on the interpretation of the compression error. For example, if a compression error has been indicated, the data selector 222 is configured to store the uncompressed data. Conversely, if a compression error has not been indicated, the data selector 222 is configured to select and manage the transfer of the compressed data.

The data selector 222 is additionally configured to provide an indication with the data stored in a destination buffer that is usable to identify whether the stored data is compressed or uncompressed. To do so, the data selector 222 is configured to generate a header that includes a field which indicates whether the data is compressed or not, and prepend the header to the compressed data. In such embodiments in which a header is already generated for the stored data, the data selector is configured to update a field in such a header of the stored data that is used to indicate whether the stored data corresponds to compressed or uncompressed data. In some embodiments, the stored data and/or data related thereto (e.g., length/size, address in memory, compression indicator, etc.) may be stored in the destination buffer data 206.

Figure 3:
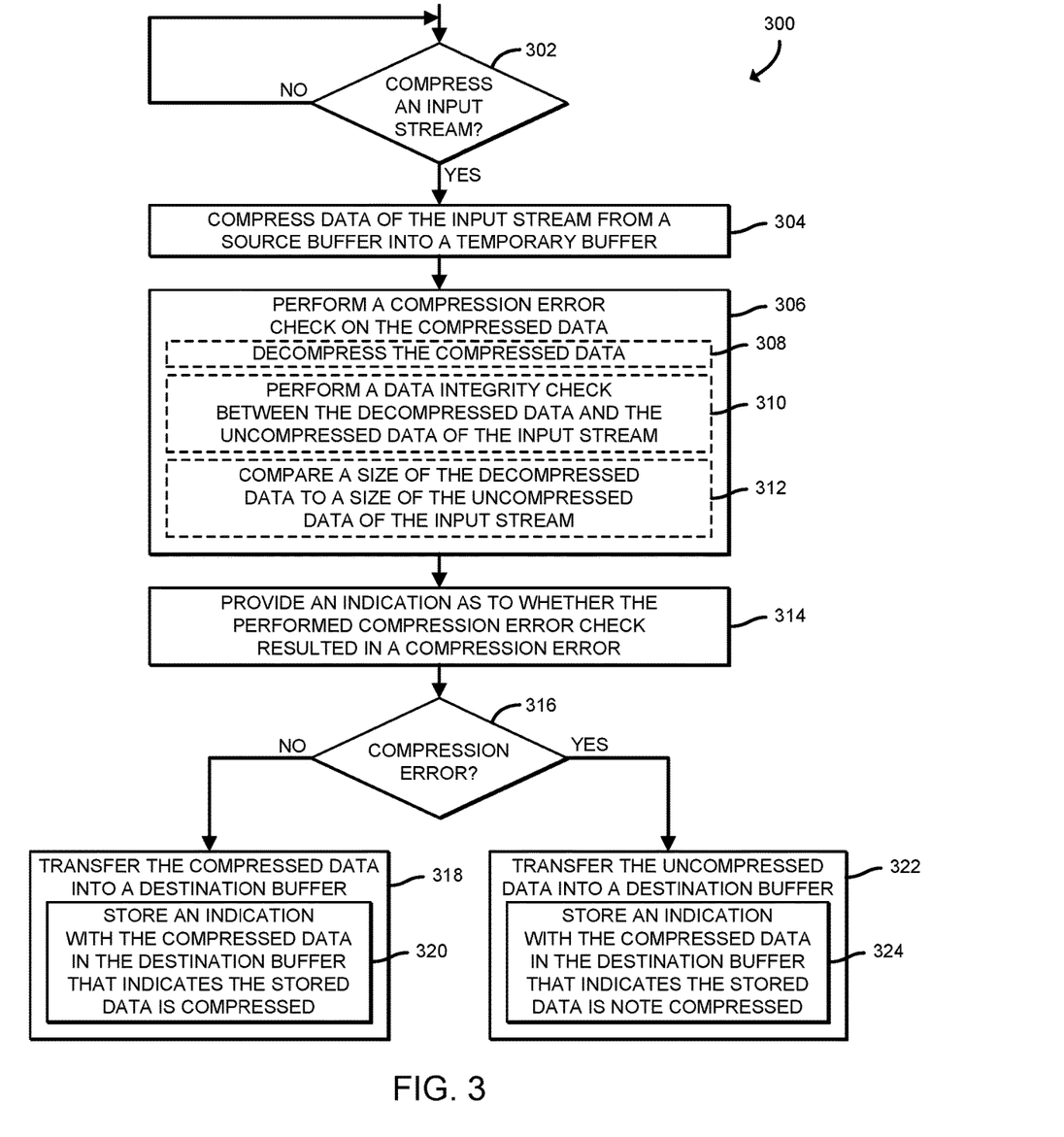
FIG. 3 is a simplified flow diagram of at least one embodiment of a method for error recovery in compressed data streams that may be executed by the compute device of FIGS. 1 and 2.

Referring now to FIG. 3, a method 300 for error recovery in compressed data streams is shown which may be executed by a compute device (e.g., the compute device 102 of FIGS. 1 and 2). The method 300 begins with block 302, in which the compute device 102 determines whether to compress data of an input stream. If so, the method 300 advances to block 304, in which the compute device 102 compresses data of the input stream from a source buffer into a temporary buffer. In block 306, the compute device 102 performs a compression error check on the compressed data. To do so, in block 308, the compute device 102 decompresses the compressed data, and transfers the decompressed data into a temporary buffer. Additionally, in block 310, the compute device 102 performs a data integrity check between the decompressed data and the uncompressed data of the input stream. Additionally or alternatively, in block 312, the compute device 102 compares a size of the decompressed data to a size of the uncompressed data of the input stream.

In block 314, the compute device 102 provides an indication (e.g., a flag setting, a generated fault, a generated exception, etc.) as to whether the performed compression error check resulted in a compression error. In block 316, the compute device 102 determines whether a compression error has been detected based on the compression error indication provided in block 314. If the compute device 102 determines that the compression was successful (i.e., the compression error indication indicates that no compression error was detected), the method branches to block 318. In block 318, the compute device 102 transfers the compressed data into a destination buffer. Additionally, in block 320, the compute device 102 stores an indication with the transferred compressed data in the destination buffer which indicates that the transferred data is the compressed data. For example, the compute device 102 may affix (e.g., prepend) a header that includes an indication that the data stored in the destination buffer is compressed.

Referring back to block 316, if the compute device 102 determines that the compression was unsuccessful (i.e., the compression error indication indicates that at least one compression error was detected), the method branches to block 322. In block 322, the compute device 102 transfers the uncompressed data into the destination buffer. Additionally, in block 324, the compute device 102 stores an indication with the transferred compressed data in the destination buffer which indicates that the transferred data is the uncompressed data. For example, the compute device 102 may affix (e.g., prepend) a header that includes an indication that the data stored in the destination buffer is uncompressed. It should be appreciated that, in some embodiments, one or more standards or other compliance requirements may need be considered when storing the transferred data and the indication. Accordingly, in those embodiments, the compute device 102 is configured to store the (un)compressed data and provide the indication whether the transferred/stored data is compressed or uncompressed in a manner consistent with the applicable standard(s) and/or compliance requirement(s).

Figure 4:
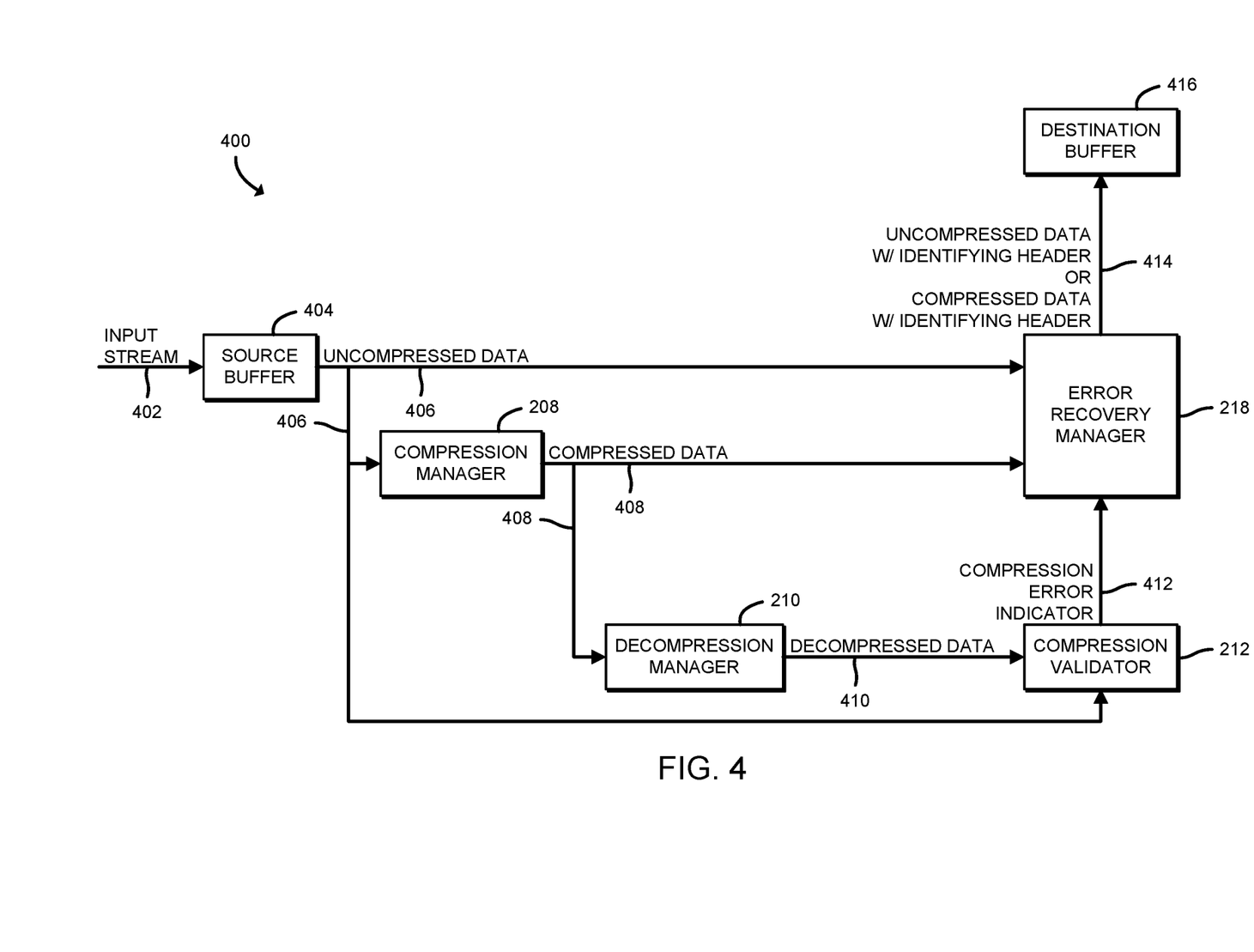
FIG. 4 is a simplified block diagram of at least one embodiment of a communication flow for error recovery in compressed data streams that may be executed by the compute device of FIGS. 1 and 2.

Referring now to FIG. 4, an illustrative communication flow 400 for error recovery in compressed data streams that may be executed by the compute device 102 is shown. The illustrative communication flow 400 includes the compression manager 208, the decompression manager 210, the compression validator 212, and the error recovery manager 218 of FIG. 2. Additionally, the illustrative communication flow 400 includes a number of data flows, some of which may be executed separately or together, depending on the respective data flow and the embodiment. In data flow 402, an input stream of data is received at a source buffer 404. It should be appreciated that the source buffer 404, as well as the destination buffer 416 described herein, has been previously allocated (e.g., to the memory 108 of the compute engine 104) by an application requesting the compression operation to be performed.

In data flow 406, the uncompressed data is transmitted to, or otherwise retrieved from, the source buffer 404 to each of the error recovery manager 218, the compression manager 208, and the compression validator 212. In data flow 408, the input uncompressed data is compressed by the compression manager 208 and output as compressed data which is forward to or otherwise retrieved by (e.g., from a temporary storage buffer (not shown)) the error recovery manager 218 and the compression validator 212. In data flow 410, the input compressed data is decompressed data by the decompression manager 210 and the output decompressed data is forwarded to or otherwise retrieved by (e.g., from another temporary storage buffer (not shown)) the compression validator 212.

In data flow 412, the compression validator 212 issues a compression error indicator (i.e., as a result of the compression error check) to the error recovery manager 218. In data flow 414, the error recovery manager 218, based on the issued compression error indicator, either transfers or otherwise initiates the storage of the uncompressed data and an error recovery manager 218, or the compressed data and the associated identifying header to the destination buffer 416. As described previously, the associated identifying header includes an indication usable to identify the data stored in the destination buffer as being compressed or uncompressed. It should be appreciated that the uncompressed data may be directly moved from the source buffer 404 to the destination buffer 416 under the control of the error recovery manager 218, such as by using generated source and destination addresses usable to send the data via a direct memory access (DMA) operation.

EXAMPLES

Illustrative examples of the technologies disclosed herein are provided below. An embodiment of the technologies may include any one or more, and any combination of, the examples described below.

Example 1 includes a compute device for error recovery in compressed data streams, the compute device comprising compression management circuitry to compress uncompressed data of an input stream to generate compressed data; compression validation circuitry to perform a compression error check on the compressed data to verify integrity of the compressed data, and determine, as a result of the performed compression error check, whether the compressed data included a compression error; and error recovery management circuitry to transfer, in response to a determination that the performed compression error check indicated that the compressed data included the compression error, the uncompressed data into a destination buffer, and store an indication with the uncompressed data into the destination buffer, wherein the indication is usable to identify that the uncompressed data has been transferred into the destination buffer.

Example 2 includes the subject matter of Example 1, and wherein to perform the compression error check on the compressed data comprises to decompress the data to generate decompressed data and perform a data integrity check between the decompressed data and the uncompressed data.

Example 3 includes the subject matter of any of Examples 1 and 2, and wherein to perform the data integrity check comprises to compare a checksum of the decompressed data against a checksum of the uncompressed data.

Example 4 includes the subject matter of any of Examples 1-3, and wherein to perform the data integrity check comprises to compare a size of the decompressed data against a size of the uncompressed data.

Example 5 includes the subject matter of any of Examples 1-4, and wherein the error recovery management circuitry is further to (i) transfer, in response to a determination that the performed compression error check indicated that the compressed data did not include the compression error, the compressed data into the destination buffer and (ii) store the indication usable to identify that the compressed data has been transferred into the destination buffer.

Example 6 includes the subject matter of any of Examples 1-5, and wherein to compress the data of the input stream comprises to (i) retrieve the data of the input stream from a source buffer and (ii) store the compressed data into a temporary buffer.

Example 7 includes the subject matter of any of Examples 1-6, and wherein to transfer the compressed data into the destination buffer comprises to transfer the compressed data from the temporary buffer to the destination buffer.

Example 8 includes the subject matter of any of Examples 1-7, and wherein to transfer the uncompressed data into the destination buffer comprises to transfer the uncompressed data from a source buffer to the destination buffer.

Example 9 includes the subject matter of any of Examples 1-8, and wherein to store the indication comprises to affix a header to the uncompressed data, wherein the header includes the indication that indicates the uncompressed data has been stored in the destination buffer.

Example 10 includes one or more machine-readable storage media comprising a plurality of instructions stored thereon that, in response to being executed, cause a compute device to compress uncompressed data of an input stream to generate compressed data; perform a compression error check on the compressed data to verify integrity of the compressed data; determine, as a result of the performed compression error check, whether the compressed data included a compression error; transfer, in response to a determination that the performed compression error check indicated that the compressed data included the compression error, the uncompressed data into a destination buffer; and store an indication with the uncompressed data into the destination buffer, wherein the indication is usable to identify that the uncompressed data has been transferred into the destination buffer.

Example 11 includes the subject matter of Example 10, and wherein to perform the compression error check on the compressed data comprises to decompress the data to generate decompressed data and perform a data integrity check between the decompressed data and the uncompressed data.

Example 12 includes the subject matter of any of Examples 10 and 11, and wherein to perform the data integrity check comprises to compare a checksum of the decompressed data against a checksum of the uncompressed data.

Example 13 includes the subject matter of any of Examples 10-12, and wherein to perform the data integrity check comprises to compare a size of the decompressed data against a size of the uncompressed data.

Example 14 includes the subject matter of any of Examples 10-13, and wherein the plurality of instructions further cause the compute device to transfer, in response to a determination that the performed compression error check indicated that the compressed data did not include the compression error, the compressed data into the destination buffer; and store the indication usable to identify that the compressed data has been transferred into the destination buffer.

Example 15 includes the subject matter of any of Examples 10-14, and wherein to compress the data of the input stream comprises to (i) retrieve the data of the input stream from a source buffer and (ii) store the compressed data into a temporary buffer.

Example 16 includes the subject matter of any of Examples 10-15, and wherein to transfer the compressed data into the destination buffer comprises to transfer the compressed data from the temporary buffer to the destination buffer.

Example 17 includes the subject matter of any of Examples 10-16, and wherein to transfer the uncompressed data into the destination buffer comprises to transfer the uncompressed data from a source buffer to the destination buffer.

Example 18 includes the subject matter of any of Examples 10-17, and wherein to store the indication comprises to affix a header to the uncompressed data, wherein the header includes the indication that indicates the uncompressed data has been stored in the destination buffer.

Example 19 includes a compute device for error recovery in compressed data streams, the compute device comprising circuitry for compressing uncompressed data of an input stream to generate compressed data; means for performing a compression error check on the compressed data to verify integrity of the compressed data; means for determining, as a result of the performed compression error check, whether the compressed data included a compression error; circuitry for transferring, in response to a determination that the performed compression error check indicated that the compressed data included the compression error, the uncompressed data into a destination buffer; and means for storing an indication with the uncompressed data into the destination buffer, wherein the indication is usable to identify that the uncompressed data has been transferred into the destination buffer.

Example 20 includes the subject matter of Example 19, and wherein the means for performing the compression error check on the compressed data comprises circuitry for decompressing the data to generate decompressed data and means for performing a data integrity check between the decompressed data and the uncompressed data.

Example 21 includes the subject matter of any of Examples 19 and 20, and wherein the means for performing the data integrity check comprises means for comparing a checksum of the decompressed data against a checksum of the uncompressed data.

Example 22 includes the subject matter of any of Examples 19-21, and wherein the means for performing the data integrity check comprises means for comparing a size of the decompressed data against a size of the uncompressed data.

Example 23 includes the subject matter of any of Examples 19-22, and further including circuitry for transferring, in response to a determination that the performed compression error check indicated that the compressed data did not include the compression error, the compressed data into the destination buffer; and means for storing the indication usable to identify that the compressed data has been transferred into the destination buffer.

Example 24 includes the subject matter of any of Examples 19-23, and wherein compressing the data of the input stream comprises retrieving the data of the input stream from a source buffer and storing the compressed data into a temporary buffer, and wherein transferring the compressed data into the destination buffer comprises to transfer the compressed data from the temporary buffer to the destination buffer.

Example 25 includes the subject matter of any of Examples 19-24, and wherein the means for storing the indication comprises means for affixing a header to the uncompressed data, wherein the header includes the indication that indicates the uncompressed data has been stored in the destination buffer.

The invention claimed is:

1. A compute device for error recovery in compressed data streams, the compute device comprising:
compression management circuitry to compress uncompressed data of an input stream from a source buffer to generate compressed data;
compression validation circuitry to:
perform a compression error check on the compressed data to verify integrity of the compressed data, and
determine, as a result of the performed compression error check, whether the compressed data included a compression error; and
error recovery management circuitry to:
transfer, in response to a determination that the performed compression error check indicated that the compressed data included the compression error, the uncompressed data from the source buffer into a destination buffer, and
store an indication with the uncompressed data into the destination buffer, wherein the indication is usable to identify that the uncompressed data has been transferred into the destination buffer, wherein to store the indication comprises to affix a header to the uncompressed data, wherein the header includes the indication that indicates the uncompressed data has been stored in the destination buffer.

2. The compute device of claim 1, wherein to perform the compression error check on the compressed data comprises to decompress the data to generate decompressed data and perform a data integrity check between the decompressed data and the uncompressed data.

3. The compute device of claim 2, wherein to perform the data integrity check comprises to compare a checksum of the decompressed data against a checksum of the uncompressed data.

4. The compute device of claim 2, wherein to perform the data integrity check comprises to compare a size of the decompressed data against a size of the uncompressed data.

5. The compute device of claim 1, wherein the error recovery management circuitry is further to (i) transfer, in response to a determination that the performed compression error check indicated that the compressed data did not include the compression error, the compressed data into the destination buffer and (ii) store the indication usable to identify that the compressed data has been transferred into the destination buffer.

6. The compute device of claim 5, wherein to compress the data of the input stream comprises to (i) retrieve the data of the input stream from a source buffer and (ii) store the compressed data into a temporary buffer.

7. The compute device of claim 6, wherein to transfer the compressed data into the destination buffer comprises to transfer the compressed data from the temporary buffer to the destination buffer.

8. One or more non-transitory, machine-readable storage media comprising a plurality of instructions stored thereon that, in response to being executed, cause a compute device to:
compress uncompressed data of an input stream from a source buffer to generate compressed data;
perform a compression error check on the compressed data to verify integrity of the compressed data;
determine, as a result of the performed compression error check, whether the compressed data included a compression error;
transfer, in response to a determination that the performed compression error check indicated that the compressed data included the compression error, the uncompressed data from the source buffer into a destination buffer; and
store an indication with the uncompressed data into the destination buffer, wherein the indication is usable to identify that the uncompressed data has been transferred into the destination buffer, wherein to store the indication comprises to affix a header to the uncompressed data, wherein the header includes the indication that indicates the uncompressed data has been stored in the destination buffer.

9. The one or more non-transitory, machine-readable storage media of claim 8, wherein to perform the compression error check on the compressed data comprises to decompress the data to generate decompressed data and perform a data integrity check between the decompressed data and the uncompressed data.

10. The one or more non-transitory, machine-readable storage media of claim 9, wherein to perform the data integrity check comprises to compare a checksum of the decompressed data against a checksum of the uncompressed data.

11. The one or more non-transitory, machine-readable storage media of claim 9, wherein to perform the data integrity check comprises to compare a size of the decompressed data against a size of the uncompressed data.

12. The one or more non-transitory, machine-readable storage media of claim 8, wherein the plurality of instructions further cause the compute device to:
transfer, in response to a determination that the performed compression error check indicated that the compressed data did not include the compression error, the compressed data into the destination buffer; and
store the indication usable to identify that the compressed data has been transferred into the destination buffer.

13. The one or more non-transitory, machine-readable storage media of claim 12, wherein to compress the data of the input stream comprises to (i) retrieve the data of the input stream from a source buffer and (ii) store the compressed data into a temporary buffer.

14. The one or more non-transitory, machine-readable storage media of claim 13, wherein to transfer the compressed data into the destination buffer comprises to transfer the compressed data from the temporary buffer to the destination buffer.

15. The one or more non-transitory, machine-readable storage media of claim 8, wherein to transfer the uncompressed data into the destination buffer comprises to transfer the uncompressed data from a source buffer to the destination buffer.

16. A compute device for error recovery in compressed data streams, the compute device comprising:
  circuitry for compressing uncompressed data of an input stream from a source buffer to generate compressed data;
  means for performing a compression error check on the compressed data to verify integrity of the compressed data;
  means for determining, as a result of the performed compression error check, whether the compressed data included a compression error;
  circuitry for transferring, in response to a determination that the performed compression error check indicated that the compressed data included the compression error, the uncompressed data from the source buffer into a destination buffer; and
  means for storing an indication with the uncompressed data into the destination buffer, wherein the indication is usable to identify that the uncompressed data has been transferred into the destination buffer, wherein the means for storing the indication comprises means for affixing a header to the uncompressed data, wherein the header includes the indication that indicates the uncompressed data has been stored in the destination buffer.

17. The compute device of claim 16, wherein the means for performing the compression error check on the compressed data comprises circuitry for decompressing the data to generate decompressed data and means for performing a data integrity check between the decompressed data and the uncompressed data.

18. The compute device of claim 17, wherein the means for performing the data integrity check comprises means for comparing a checksum of the decompressed data against a checksum of the uncompressed data.

19. The compute device of claim 17, wherein the means for performing the data integrity check comprises means for comparing a size of the decompressed data against a size of the uncompressed data.

20. The compute device of claim 17, further comprising:
  circuitry for transferring, in response to a determination that the performed compression error check indicated that the compressed data did not include the compression error, the compressed data into the destination buffer; and
  means for storing the indication usable to identify that the compressed data has been transferred into the destination buffer.

21. The compute device of claim 20, wherein compressing the data of the input stream comprises retrieving the data of the input stream from a source buffer and storing the compressed data into a temporary buffer, and wherein transferring the compressed data into the destination buffer comprises to transfer the compressed data from the temporary buffer to the destination buffer.

* * * * *